United States Patent

Teng

Patent Number: 5,087,591
Date of Patent: Feb. 11, 1992

[54] CONTACT ETCH PROCESS

[75] Inventor: Clarence W. Teng, Plano, Tex.

[73] Assignee: Texas Instruments Incorporated, Dallas, Tex.

[21] Appl. No.: 169,078

[22] Filed: Mar. 16, 1988

Related U.S. Application Data

[60] Continuation of Ser. No. 936,958, Dec. 1, 1986, abandoned, which is a division of Ser. No. 693,482, Jan. 22, 1985, abandoned.

[51] Int. Cl.$^5$ .................................. H01L 21/302
[52] U.S. Cl. .................................. 437/225; 437/235; 437/238; 437/233; 156/643; 156/644; 156/652; 156/653
[58] Field of Search ............ 437/235, 233, 240, 241, 437/242, 237, 245, 225, 238, 239; 156/643, 644, 652, 653; 357/52, 53, 23.6, 23.8, 29

[56] References Cited

U.S. PATENT DOCUMENTS

| | | | |
|---|---|---|---|
| 3,811,076 | 5/1974 | Smith, Jr. | 357/53 X |
| 4,021,789 | 3/1977 | Furman et al. | 357/23.6 X |
| 4,094,057 | 6/1978 | Bhattacharyya et al. | 357/23.6 X |
| 4,324,038 | 4/1982 | Chang et al. | 29/591 |
| 4,414,057 | 11/1983 | Bourassa et al. | 156/652 |
| 4,489,481 | 12/1984 | Jones | 29/591 |
| 4,571,816 | 2/1986 | Dingwall | 29/571 |
| 4,619,037 | 10/1986 | Taguchi et al. | 29/591 |
| 7,964,009 | 11/1977 | Chiu et al. | 357/59 X |

FOREIGN PATENT DOCUMENTS

| | | | |
|---|---|---|---|
| 60-4265 | 1/1985 | Japan | 357/53 |
| 2045525 | 10/1980 | United Kingdom | 357/23.8 |

OTHER PUBLICATIONS

Abbas, S. A., Barile, C. A. and Dockerty, R. C., "Doped Polycrystalline Field Shield Process" IBM Tech. Disc. Bull. 15(6), Nov. 1972, p. 1981.

Ghandhi, *VLSI Fabrication Principles*, John Wiley and Sons, Inc., 1983, pp. 420–424.

Webster's Ninth New Collegiate Dictionary, Merriam-Webster, Inc. 1986, p. 276.

*Primary Examiner*—Olik Chaudhuri
*Assistant Examiner*—M. Wilczewski
*Attorney, Agent, or Firm*—Douglas A. Sorensen; Richard L. Donaldson; James C. Kesterson

[57] ABSTRACT

Contact etching is simplified by including a conformal etch stop layer underneath the interlevel or multilevel oxide (MLO). Etching through the unequal thickness of the MLO with sufficient overetching to reliably clear the thickest parts of the MLO layer will therefore not damage the silicon contact areas underneath the thinner parts of the MLO. Process control is also improved.

Preferably this conformal etch stop layer is a conductor, and is grounded to configure a field plate over the entire surface of the chip.

26 Claims, 5 Drawing Sheets

CONTACT ETCH PROCESS

This application is a continuation, of application Ser. No. 936,958, filed 12/01/86, now abandoned, which is a division of application Ser. No. 693,482, filed 1/22/85, now abandoned.

BACKGROUND AND SUMMARY OF THE INVENTION

The present invention relates to integrated circuits and to processes for fabrication of integrated circuits.

In a wide variety of integrated circuit processes, a contact etch step is necessary. For example, polysilicon-gate MOS transistors, separated by field oxide regions, would be covered up by a planarizing insulator or "MLO" layer, which could be any one of a number of dielectrics, such as BPSG (borophosphosilicate glass), OCD (spin-on silicate glass), PSG (phosphosilicate glass), or TEOS oxide (silicon oxides vapor deposited from a tetraethylorthosilane gas flow). To usefully interconnect the poly-gate active devices, it is necessary to cut through the MLO to make contact to selected locations in the polysilicon gate level and to selected locations in the source/drain diffusions of the MOS transistors. The contact holes thus opened will be interconnected by a patterned layer of a conductor such as aluminum to configure the desired electric circuit.

Each contact will impose a series resistance in the circuits which include it, and excessive series resistance in the contacts may cause the circuits to be slow or defunct. This danger of excessive contact resistance imposes processing constraints on the contact etch. First, the contact hole must be cleared: if the bottom of the hole is partly covered by remnants of the MLO or by residues from etching the MLO, the electrically effective area of the contact will be reduced, and, for a given specific contact resistance, the series resistance through the contact will obviously increase. Second, the silicon exposed at the bottom of the contact hole should not be damaged too much by overetching: if silicon at the bottom of some contact holes is exposed to a prolonged overetch it is likely to be pitted, even if the etch is nominally selective to silicon. Moreover, during prolonged overetching it is also possible to redeposit on the exposed silicon small quantities of dielectric which have been sputtered off of the contact hole's sidewalls. Third, no etch is infinitely selective, and, if the overetching period is very much prolonged, even a reasonably selective etch may erode enough silicon from the exposed areas to cause problems (such as excessive spreading resistance under the contact, or even cutting right through the source/drain junctions to short-circuit to the substrate). This is a particular problem where siliciding is used (as is now common), since a substantial fraction of the silicide layer over the poly gate level or over the source/drain regions may be removed by prolonged overetching.

Obtaining a reliable contact etch process has been a major problem in fabricating VLSI circuits. Processing control of this step is impeded by three sources of difficulty: (1) the plasma etch rate in small openings is inherently uncertain, (2) the contact etch must cut through various MLO thicknesses across the wafer, and (3) normal endpoint detection techniques do not work, so overetch must be added onto an endpoint estimated (imprecisely) by timing, rather than onto a measured endpoint, so the additional overetch must be used to allow for this imprecision. For all these reasons, substantial overetch (i.e. etching for more than the time required to clear from a flat surface the thickness of MLO which overlies the contact hole location) is necessary to assure that the contact is clear.

Normal endpoint detection techniques are of no use in contact etching, simply because of insufficient signal due to small total area exposed to plasma. The oxide thickness left in the bottom of contact holes cannot be detected by instruments such as Nanospace (TM), because the holes are much smaller than the minimum size (of detection) for Nanospace. In general, there is no efficient way to tell whether the contacts (in integrated circuits using micron dimensions) are clear and without oxide resistance.

Engineer inspection of the results of a contact etching step is also not easy because of the limitations of inspection tools. Contact resistance is very sensitive to the residual oxide in the contact. Resistance can increase several orders of magnitude even when the oxide thickness is only a few nanometers. However, no commercially available equipment can detect this residual oxide layer in a micron-sized contact. Microscopes (such as an SEM) may provide the contact profiles, but cannot resolve oxide layers which may be only a few nanometers thick. Nanospec machines (TM) and ellipsometers are commonly used in the industry to measure thin oxide thickness, yet they cannot pinpoint the characteristics of a small geometry such as the contact holes.

Another reason why substantial overetch is normally necessary is because of the variation of plasma etch rate in small areas. Plasma etching rates tend to be reduced when the geometry of the openings is small, due to gas transfer rate limitations, and therefore the etch rate will be pattern-dependent. (This becomes even more of a problem when very steep-walled contact holes are used, as is increasingly preferable.) As a result, a substantial amount of overetching (typically up to about 70%) is needed to assure that the contact is clear.

The amount of required overetching is further increased by the thickness variation of the MLO layer. The variation not only comes from the nature of deposition, but also because of the steps (such as poly gate) created in structures which are later smoothed out by oxide planarization for metal step coverage and lithography purposes. That is, the MLO layer preferably has a nearly flat surface, but the structure is covers is not flat, and therefore the MLO layer is thicker in some places than in others. This thickness variation can easily be as much as 5000 A. When a single contact etch is used to make the contacts both to source/drain and to gate, as is usual, the gate contact holes will be greatly overetched by the time the source/drain contact holes are cleared. FIG. 1 shows a sample prior art structure illustrating this: the contact etch, which cuts through MLO layer 16, must simultaneously etch through a thickness t1 to permit contact to the source/drain diffusions 13, while etching through only thickness t2 over the poly gate 15. Moreover, the contact etch should preferably not etch through the silicide layers 11, and certainly not through the source/drain junctions 10. This can be a particular problem at the edge of field oxide 17, where implantation of the source/drain diffusion 13 may have been partially masked by the edge of the field oxide 13 and/or partially counterdoped by the channel stop doping under the field oxide. Thus, if the contact hole mask slightly overlaps the edge of the field oxide 17, as it easily may, it is particularly easy for overetching to cut through diffusion 13 and short-circuit to substrate.

The overetching of contacts can result in an excessive loss of the underlying layers. This is a very serious problem since the "crater" formed in silicon source/drain areas may cause a short circuit between the junction and the substrate after the metal is deposited. This mischance becomes more likely as the junction depth is scaled down, which is to be expected as VLSI gets more compact. Furthermore, if silicide is used to reduce series resistance in both gate and source/drain regions, the chances of etching through this silicide layer (which might be, for example, 1000 Angstroms thick) are even higher. This is likely to cause excessive spreading resistance around the contact and degrade circuit performance.

Thus, the prior art presents the crucial problem that, for various reasons, a tremendous amount of overetching is normally needed when etching contact holes, but this overetching degrades the underlying circuit elements.

The present invention solves these shortcomings of the prior art, and also provides other advantages, by providing a reliable contact etch process which is more tolerant to overetching. One basic idea of the present invention is to transfer the etch nonuniformity to a conformal (not planar) intermediate layer which serves as an etch stop.

In one class of embodiments of the present invention, a conductive layer is used as the intermediate layer. This layer not only provides important processing advantages, but also can be used to provide field-plate assisted isolation over the whole integrated circuit structure. This is not lateral field-plate isolation, as is common, but vertical field-plate isolation, which reduces cross-talk between poly and metal levels, and between metal and moat. Such a global field plate also provides improved radiation hardness.

This global field-plate isolation is particularly advantageous in high-voltage circuits, where the voltage present in power lines or other metal lines may be enough to cause anomalous transistor turnon or turnoff, even through a normal thickness of PSG or other MLO dielectric intervenes.

Thus, in general, the present invention teaches a process wherein a thin dielectric interface layer, such as good quality oxide, is first conformally deposited or grown. Next, the intermediate layer (e.g. doped polysilicon) is conformally deposited. Next, the bulk of the MLO is deposited and planarized. The contact holes are patterned, e.g. with photoresist, and the MLO is etched using the required overetch, using an etch which stops on the material of the intermediate layer. The intermediate layer portions which are exposed at the bottoms of partially etched contact holes are then etched away, and a short final etch removes the thin conformal oxide layer.

Although a thin layer (or layers) of additional materials is provided underneath the planarizing MLO layer, the gettering advantages of a heavily phosphorus-doped MLO are preserved. That is, the phosphorus doping in PSG or BPSG serves to getter metal-ion contamination, but this gettering will still occur when the PSG or BPSG is separated from the underlying active device structures by 2000 Angstroms or so of oxide, polysilicon, etc.

The conformal oxide layer provides optimal interface to the active device regions, and is preferably made thick enough (e.g. 500–1500 Angstroms) to minimize charge-up. Thus, the required overetching of the MLO may damage the intermediate layer, but does not damage the underlying structures. The only overetching to which the underlying structures are exposed is the amount of overetching necessary to clear the thin conformal oxide layer which underlies the intermediate layer; however, this will be much less (typically by a factor of 10 or more) than the amount of overetching which would be required to clear the whole MLO.

Thus the present invention provides the advantage that contact holes are etched through thick MLO of varying thickness without exposing the underlying structures to extensive overetch.

A further advantage of the present invention is that it can be used in combination with a wide variety of contact etching processes. That is, various etch processes (cantilever etch mask, high pressure plasma etching, BPSG reflow, etc.) can be used to provide a controlled sidewall slope for the contact hole, and the present invention can be used in combination with most of these processes, as long as the etch used to cut through the MLO planarizing layer is selective with respect to the intermediate layer.

A further advantage of the present invention is that it does not entail much additional process complexity.

According to the present invention there is provided: A method for fabricating integrated circuits, comprising the steps of: providing a substrate having thereon a partially fabricated integrated circuit structure; providing upon said partially fabricated integrated circuit structure a conformal dielectric layer, conformally depositing over said conformal dielectric layer an intermediate layer consisting essentially of a material which can be etched selectively with respect to said conformal dielectric layer, depositing over said intermediate layer an MLO layer comprising a thick planarizing layer of a dielectric material which can be etched selectively with respect to said intermediate layer, and providing a masking layer above said MLO layer to define contact holes in predetermined locations; etching said MLO layer in accordance with said masking layer to open a plurality of contact holes each having a portion of said intermediate layer exposed at the bottom thereof, etching away said exposed portions of said intermediate layer from said bottoms of said contact holes, to expose said conformal dielectric at said bottoms of said holes, and etching away said exposed portions of said conformal dielectric from said bottoms of said holes, to expose underlying portions of said partially formed integrated circuit structures; and providing a patterned conductive layer to interconnect said contact holes to configure a predetermined electrical circuit.

BRIEF DESCRIPTION OF THE DRAWING

The present invention will be described with reference to the accompanying drawings, wherein:

FIG. 12 shows a larger-scale view of the structure of FIG. 8 after metal has been deposited and patterned to form a contact to a portion of substrate 10 which is insulated from the field plate 14.

DESCRIPTION OF THE PREFERRED EMBODIMENTS

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
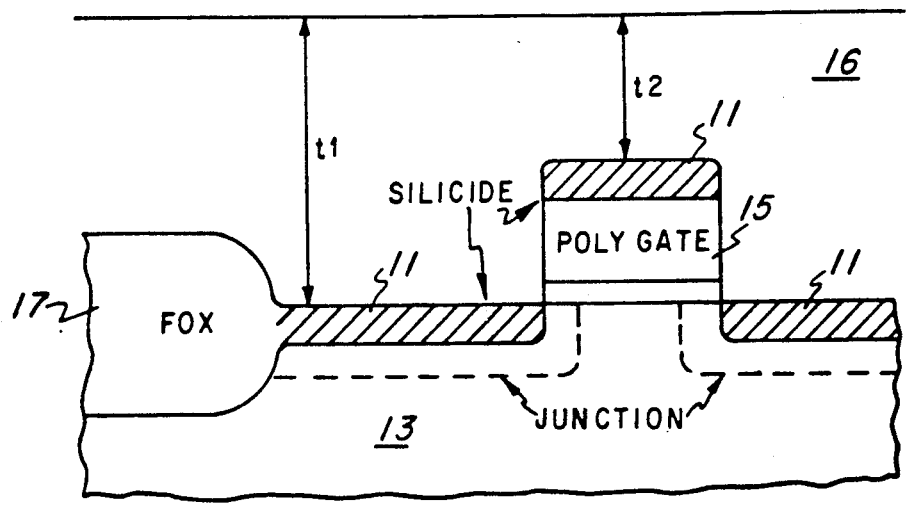
FIG. 1 shows a prior art structure, wherein it is necessary to etch contact holes through very different thickness of MLO to make contact both to a silicided moat diffusion and to a silicided polysilicon gate.
Figure 2:
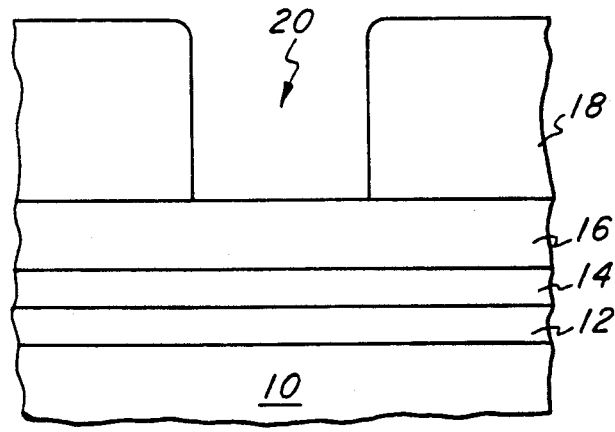
FIGS. 2–6 show sequential steps in fabrication of contact holes according to the present invention.

FIG. 2 shows a first stage in constructing a sample embodiment of the invention. Over an underlayer 10, containing, for example, integrated circuit structures such as shown in FIG. 1, a conformal oxide 12 is formed, either thermally or by deposition or both. This oxide is preferably about 1000 Angstroms thick, but may be as thin as 100 Angstroms or as thick as 2000. It may be a TEOS deposited oxide, or 100 Angstroms of grown oxide (over silicon-containing structures) covered by 900 Angstroms of deposited oxide, or may be formed in other ways as will be obvious to those skilled in the art. Part of the function of this conformal oxide layer is to provide a good interface to active device structures, and such conformal oxide interface layers are already known in the art to be useful for this purpose. Another purpose of this oxide layer is to prevent the silicon substrate from being doped by the outdiffusion of phosphorus contained in PSG or BPSG for MLO.

The next step is to deposit the intermediate layer 14 over the conformal oxide layer 12. The layer 14 may be dielectric or conductive, although a conductive material is preferred. The material used for the intermediate layer 14 must be capable of acting as an etch stop for the layer 16, but a wide variety of materials can be used for the layer 14. For example, various embodiments of the invention use doped and undoped polysilicon, aluminum, molybdenum, silicides, or various other materials. Conductive materials are generally preferred for this layer, since a conductor can be grounded to define its potential, whereas some insulators may collect charge at their interfaces in an unpredictable, life-history-sensitive manner. The presently preferred embodiment uses 1000 Angstroms of POCl3-doped polysilicon for the layer 14.

Next, the MLO layer 16 is deposited. (The terminology "MLO" is used, in describing the present invention, to refer to layer 16 as distinguished from intermediate layer 14. This is not quite standard terminology.) The MLO layer 16 uses essentially any material and thickness which could have been used for the MLO layer in a prior art device which did not have an intermediate layer 14. For example, the presently preferred embodiment uses a one micron layer of phosphosilicate glass, but BPSG, OCD (spin on glass), or polyimides could be used instead.

The predetermined pattern of the contact hole locations is then patterned conventionally, e.g. using photoresist layer 18.

The MLO layer 16 is now plasma etched using an etchant gas which will stop on the material of the intermediate layer 14. In the presently preferred embodiment, an etchant gas mixture of trifluoromethane plus perfluoroethane plus oxygen plus helium is used for this step. However, as well known to those skilled in the art, a tremendous variety of other etches could be used instead. Note that, although the presently preferred embodiment uses a highly anisotropic etch to cut the MLO, this is not strictly necessary, and etches which produce a more sloped sidewall in the MLO can be used instead. This etching step stops on the intermediate layer 14.

Figure 3:
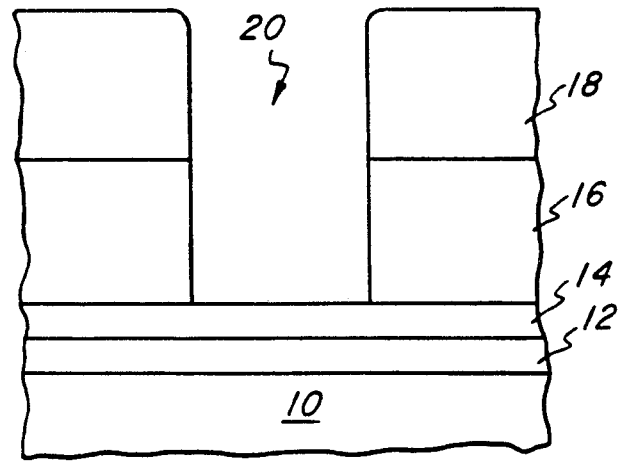

This results in the structure of FIG. 3. Next, the intermediate layer 14 is etched where it is exposed at the bottoms of the contact holes. In the presently preferred embodiment, where the intermediate layer 14 is doped polysilicon, this etching step uses tetrachloromethane plus chlorine plus helium, but of course many other etchants could be used. The etch preferably used at this step is anisotropic, but less anisotropic etches could also be used, for example to produce undercut in the exposed portions of intermediate layer 14 and reduce the danger of shorting at contact hole sidewalls. This etching step is preferably a selective etch which stops on the conformal oxide 12.

Figure 4:
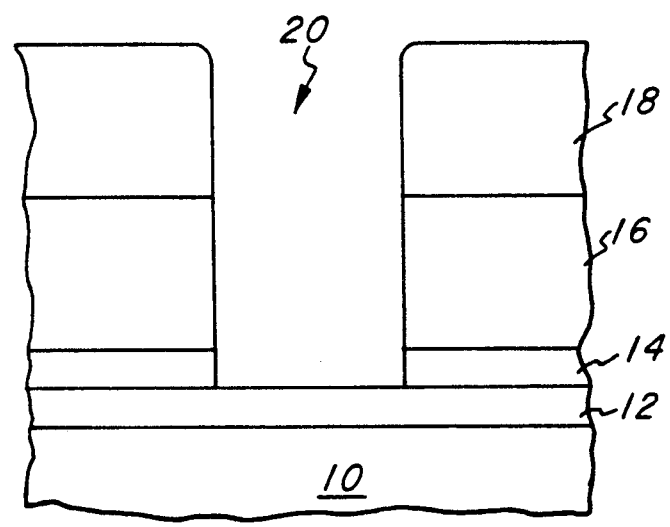

Next, in the structure of FIG. 4, the portions of the conformal oxide 12 which are exposed at the bottoms of the contact holes are removed. In the presently preferred embodiment, this is done by plasma etching using the same feed gas composition as is used to cut the MLO layer, but, again, a wide variety of etch conditions could be substituted.

Figure 5:
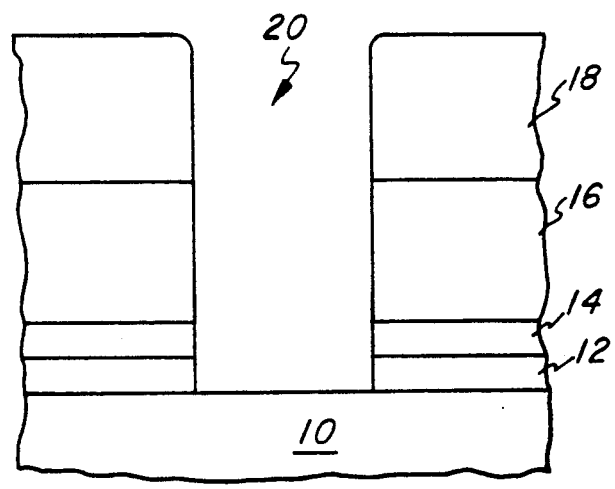

This produces the structure shown in FIG. 5. Removal of the photoresist 18, for example in an oxygen plasma asher, then produces the structure of FIG. 6. Alternatively, the conformal oxide layer 12 may be etched after the photoresist is removed, since removing the photoresist will typically produce an additional thin coating of native oxide which must be removed from the bottom of the contact hole anyway. This means that the MLO layer will be thinned when the oxide layer 12 is removed, but MLO layer 16 can be made thick enough to allow for this.

Figure 6:
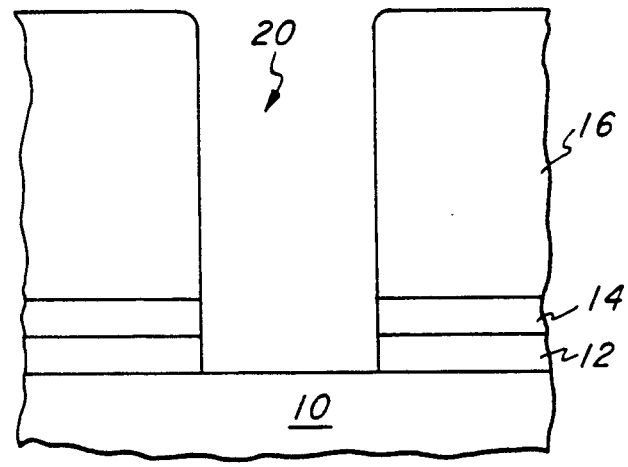

The structure of FIG. 6 shows a completed contact hole, ready for reflow of the MLO layer 16 (if desired) and metal deposition and patterning, in those embodiments where the intermediate layer 14 is an insulator. However, where layer 14 is a conductor, additional steps are desirable.

Figure 7:
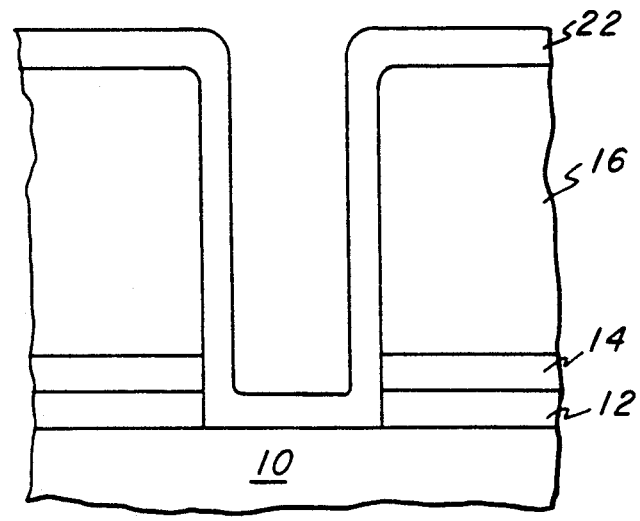
FIGS. 7 and 8 show additional further steps, subsequent to the steps shown in FIGS. 1–6, preferably used when the intermediate layer is a conductor.
Figure 8:
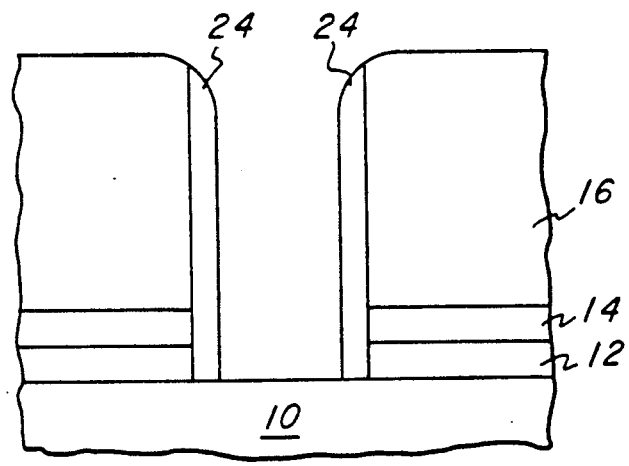

In this class of embodiments, a conformal insulator 22 is deposited (e.g. a thousand Angstroms of TEOS oxide), as shown in FIG. 7, and etched anisotropically to leave sidewall filaments 24, as shown in FIG. 8. These sidewall filaments prevent short-circuiting of the conductive intermediate layer 14 to the metal which will be deposited in the contact hole. The sidewall filaments 24 narrow the size of the contact hole 20, but this may actually be desirable, to ensure alignment between a minimum-geometry contact and a minimum-geometry metal line.

A criterion for the intermediate layer is that its etch rate in plasma for PSG/OCD etching is small compared to PSG/OCD etch rate. The intermediate layer may be dielectric or conductive. If it is a conductor, a sidewall process is needed to seal the intermediate layer so that the metal which will be deposited into contact holes is not shorted everywhere. Although use of a conductive intermediate layer requires more steps to process, using a conductive intermediate layer has the advantage of providing an efficient, global, field plate isolation.

Figure 9A:
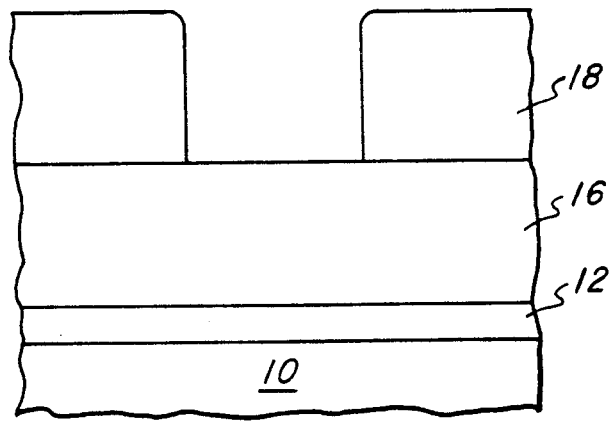
FIGS. 9A and 9B compare a prior art structure with a structure according to the present invention.
Figure 9B:
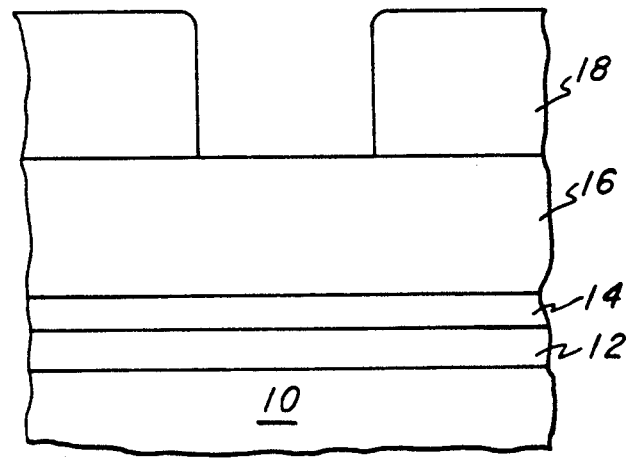

To explain how the intermediate layer is able to improve the contact etching process, an example is given as follows, with reference to FIGS. 9A (showing a sample prior art structure) and 9B (showing a sample embodiment of the present invention): Suppose the etch ratio between oxide and silicon (or poly) is 10:1 with oxide etch chemistry. Therefore in the structure of FIG. 9A, when the 10,000 A of PSG 16 and 1000 A oxide layer 12 are etched with a 50% overetch (which is typical), somewhere in the contact hole the underlying silicon layer 10 will be etched off by about 550 A. Suppose now, for the structure of FIG. 9B, that the intermediate layer 14 is polysilicon: then the etch process which cuts PSG layer 16 will consume 500 A of this poly layer (with 50% oxide overetching). In other words, the poly thickness left varies between 500–1000 A. Suppose now a poly etching process is used, for etching the intermediate layer 14, which has 10:1 selectivity over oxide, and a 50% overetch is used to clear the poly layer 14: then the oxide 12 underneath will be etched to a depth varying from 0–100 A (worst case). That is, the thickness of layer 12 varies from 900–1000 A after etching. Finally, a second oxide etching is performed to clear this oxide 12, and, with 50% overetch, the silicon substrate 10 may be eroded to a depth of 60 A at most. Thus the present invention advantageously reduces the amount of substrate erosion by about an order of magnitude.

When an integrated circuit structure is planarized with interlevel oxide (ILO) or multilevel oxide (MLO), which is generally PSG or OCD, the variation of ILO or MLO thickness is significant as described before. Without using the intermediate layer 14 taught by the present invention, the erosion of the silicon layer 10 can be a very serious problem. It is even more serious when silicide is used on gates and/or source/drain regions. Because the silicide is typically very thin (e.g. about 1000 A), the entire silicide layer may be removed inadvertently by the contact etching step. The use of intermediate layer 14 is advantageous to reduce the consumption of the silicide layers.

There are many plasma etching processes which provide high selectivity between two kinds of films. Several examples are listed below:

| Chemistry | Etch rate | ratio |
| --- | --- | --- |
| A CHF$_3$/C$_2$F$_6$/O$_2$/He | PSG:150A/Sec POCl$_3$/poly:14A/sec | >10:1 |
| B CCl$_4$/Cl$_2$/He | Poly:5400A/min Oxide:490/min | >10:1 |
| C CCl$_4$/Cl$_2$/He/BCl$_3$ | Al—Si, Al:6700A/Min PSG:500A/Min | >10:1 |
| D BCl$_3$/Cl$_2$/N$_2$ | Mo, MoSi$_2$ >400A/min Oxide:80A/min | >5.1 |

The examples given above indicate that poly, silicon-doped aluminum, Al, Mo, and MoSi$_2$ are all available for intermediate layer 14. The PSG can be etched with the A process, followed by B or C or D for the intermediate layer etch. Then, by repeating step A, the thin oxide 12 underneath the intermediate layer can be removed.

Notice that the intermediate layer examples shown above are all conducting layers. A conductive intermediate layer is preferred because it also serves as an isolation layer, or protective guarding layer, so that the circuitry under this layer will not be affected by the metal power lines, for instance, provided the intermediate layer is tied to some fixed potential level, e.g. grounded to zero volts. In other words, no matter what the voltage and current is on the metal lines which lie above IL, the devices in the substrate will not be affected.

A grounded plate is especially important in the case of high voltage devices. Because of the high voltage across the metal lines, the devices under it may couple the signal, causing transistor turnon or turnoff regardless of the thick insulating PSG layer in between. In this invention, the grounded conducting layer also serves the purpose of improved device stability, besides facilitating the contact etching process.

An extra mask is needed to ground the plate. Nevertheless, the lithography is very simple, as easy as PO (protective overcoat). A schematic design of the mask modifications necessary is given in FIGS. 10 and 11.

Figure 10:
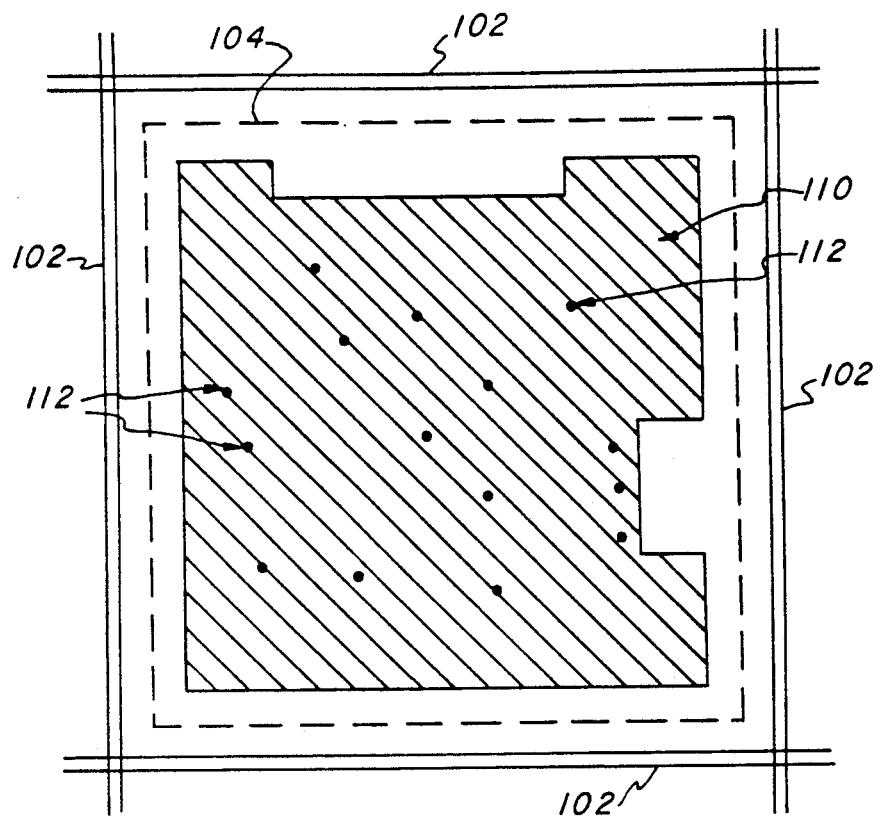
FIG. 10 shows a plan view of a contact mask used in practicing several embodiments of the present invention, wherein, at the same time the contact holes are being etched, a portion of the MLO and intermediate layer is also etched away from the border of the slice, so that the scribe lines do not short the intermediate layer to the substrate at the edge of the chip, in embodiments where the intermediate layer is not held at the same potential as the substrate (e.g. where substrate bias is used)

As shown in FIG. 10, the contact mask 104 is preferably modified slightly to prevent shorting between intermediate layer 14 and the silicon substrate via the scribe lines 102. The area 110 shows generally an integrated circuit active device area, including a plurality of contact hole locations 112 (of which a few are shown schematically). The mask 104 which patterns these contact holes 112 is preferably truncated at the boundary shown, short of the scribe lines 102.

Figure 11:
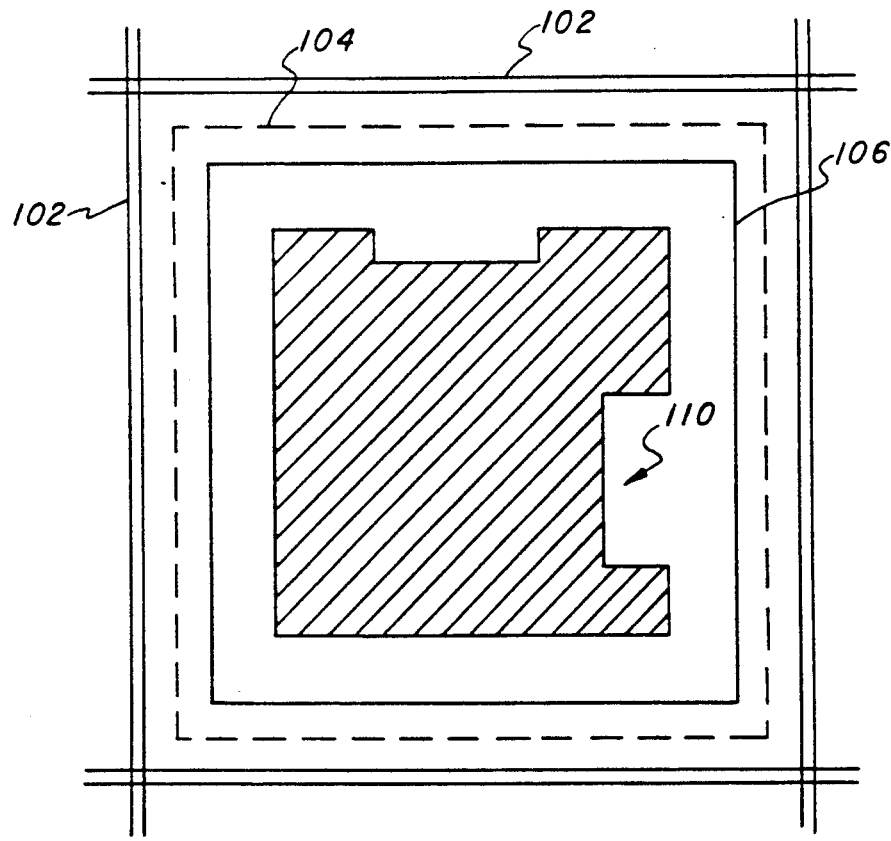
FIG. 11 shows an example of a mask which might be used for grounding the conductive intermediate layer.

FIG. 11 shows the contact hole mask 104 (also known in the art as a CTOR mask, for "contact oxide removal") in relation to the field plate mask 106. Again, the whole area of active devices is shown generally as 110. The field plate mask 106 is used to ground the ground plate (intermediate layer) 14. Note that field plate mask 106, unlike CTOR mask 104, is not complex: it (preferably) merely exposes a portion of the edge of the field plate so that contact can be made. If a patterned second metal level is used, second metal can also be used to make contact to the field plate under the first level metal. This may be performed either before or after the via patterning and etching steps, if second metal is used. Other means of making contact to the field plate may of course be used.

Optionally, field plate lithography may be performed either before or after CTOR (contact oxide removal), although it is preferably performed after the contact hole patterning step. The boundary of the CTOR mask removes both the field plate and the overlying MLO layer, whereas the etch used with mask level 106 removes only the MLO 16 and not the intermediate layer 14.

The present invention may be modified and varied in a wide variety of other ways. For example, it is not strictly necessary to use the conformal oxide layer 12 under the intermediate layer 14: if the intermediate layer 14 is itself made from a dielectric which gives an acceptable interface to active device areas, and which can be etched to stop on silicon, and which can act as an etch stop for the MLO layer 16, then the layer 12 can be dispensed with. However, such embodiments are not the most preferable.

The present invention has been described with reference to various illustrative sample embodiments, but the novel concepts of the present invention can be incorporated in a tremendous range of modifications and variations, and accordingly the scope of the present invention is expressly not limited except as set forth in the claims.

What is claimed is:

1. A method for fabricating integrated circuits, comprising the steps of:
    (a) providing over a partially fabricated integrated circuit structure a conformal dielectric layer, a conformal intermediate layer over said conformal dielectric layer, and a planarizing layer over said intermediate layer;
    (b) i. providing a masking layer above said planarizing layer to define contact holes in predetermined locations, ii. selectively etching said planarizing layer in accordance with said masking layer to open a plurality of contact holes each having a portion of said intermediate layer exposed at the bottom thereof. iii. selectively etching away said exposed portions of said intermediate layer from said bottoms of said contact holes to expose said conformal dielectric layer at said bottoms of said holes, and iv. selectively etching away said exposed portions of said conformal dielectric layer from said bottoms of said holes to expose underlying portions of said partially formed integrated circuit structures; and
    (c) providing a patterned conductive layer to interconnect said contact holes to configure a predetermined electrical circuit.

2. The method of claim 1, wherein said conformal dielectric layer is less than 2000 Ångstroms thick.

3. The method of claim 1, wherein said intermediate layer is less than 3000 Ångstroms thick.

4. The method of claim 1, wherein said planarizing layer is more than 5000 Ångstroms thick at its thickest point.

5. The method of claim 1, wherein said intermediate layer consists essentially of a dielectric.

6. The method of claim 1, wherein said intermediate layer comprises a conductive material.

7. The method of claim 6, further comprising the additional step, subsequent to said step of etching through exposed portions of said intermediate layer, of depositing sidewall filaments in said contact holes to cover remaining laterally exposed portions of said intermediate layer.

8. The method of claim 6, further comprising the subsequent step, subsequent to said step of depositing a patterned conductive layer, of making electrical contact between said intermediate layer and a reference voltage source.

9. The method of claim 6, wherein said intermediate layer comprises doped polysilicon.

10. The method of claim 1, wherein said step of depositing said planarizing layer comprises spinning on silicate glass.

11. The method of claim 1, wherein said conformal dielectric layer is deposited by chemical vapor deposition from TEOS gas.

12. A method for fabricating integrated circuits, comprising the steps of:
    (a) providing a substrate having thereon a partially fabricated integrated circuit structure;
    (b) providing over said partially fabricated integrated circuit structure a conformal intermediate layer consisting essentially of a material which can be etched selectively with respect to silicon, depositing over said intermediate layer a thick planarizing layer comprising a dielectric material which can be etched selectively with respect to said intermediate layer, and providing a masking layer above said planarizing layer to define contact holes in predetermined locations;
    (c) etching said planarizing layer in accordance with said masking layer to open a plurality of contact holes each having a portion of said intermediate layer exposed at the bottom thereof, and etching away said exposed portions of said intermediate layer from said bottoms of said contact holes, to expose underlying portions of said partially formed integrated circuit structures: and
    (d) providing a patterned conductive layer to interconnect said contact holes to configure a predetermined electrical circuit.

13. A method for fabricating integrated circuits, comprising the steps of:
    (a) providing over a partially fabricated integrated circuit structure a conformal intermediate layer, and a planarizing layer over said intermediate layer:
    (b) providing a masking layer above said planarizing layer to define contact holes in predetermined locations, selectively etching said planarizing layer in accordance with said masking layer to open a plurality of contact holes each having a portion of said intermediate layer exposed at the bottom thereof, and selectively etching away said exposed portions of said intermediate layer from said bottoms of said contact holes to expose underlying portions of said partially formed integrated circuit structures; and
    (c) providing a patterned conductive layer to interconnect said contact holes to configure a predetermined electrical circuit.

14. A method for fabricating integrated circuits comprising the steps of:
    (a) providing over a partially fabricated integrated circuit structure a dielectric layer, an intermediate layer over said dielectric layer and a planarizing layer over said intermediate layer;
    (b) i. providing a masking layer above said planarizing layer to define contact holes in predetermined locations; ii. selectively etching said planarizing layer in accordance with said masking layer to open a plurality of contact holes each having a portion of said intermediate layer exposed at the bottom thereof; iii. selectively etching away said exposed portions of said intermediate layer from said bottoms of said contact holes to expose said dielectric layer at said bottoms of said holes; and iv. selectively etching away said exposed portions of said dielectric layer from said bottoms of said holes to expose underlying portions of said partially formed integrated circuit structures; and
    (c) providing a patterned conductive layer to interconnect said contact holes to configure a predetermined electrical circuit.

15. The method of claim 14 wherein said dielectric layer is less than 2000 Angstroms thick.

16. The method of claim 14 wherein said intermediate layer is less than 3000 Angstroms thick.

17. The method of claim 14 wherein said planarizing layer is more than 5000 Angstroms thick at its thickest point.

18. The method of claim 14 wherein said intermediate layer consists essentially of a dielectric.

19. The method of claim 14 wherein said intermediate layer comprises a conductive material.

20. The method of claim 19 further comprising the additional step, subsequent to said step of etching through exposed portions of said intermediate layer, of depositing sidewall filaments in said contact holes to cover remaining laterally exposed portions of said intermediate layer.

21. The method of claim 19 further comprising the subsequent step, subsequent to said step of depositing a patterned conductive layer, of making electrical contact between said intermediate layer and a reference voltage source.

22. The method of claim 19 wherein said intermediate layer comprises doped polysilicon.

23. The method of claim 14 wherein said step of depositing said planarizing layer comprises spinning on silicate glass.

24. The method of claim 14 wherein said dielectric layer is deposited by chemical vapor deposition from TEOS gas.

25. A method for fabricating integrated circuits, comprising the steps of:
 (a) providing a substrate having thereon a partially fabricated integrated circuit structure;
 (b) providing over said partially fabricated integrated circuit structure an intermediate layer consisting essentially of a material which can be etched selectively with respect to silicon, depositing over said intermediate layer a thick planarizing layer comprising a dielectric material which can be etched selectively with respect to said intermediate layer, and providing a masking layer above said planarizing layer to define contact holes in predetermined locations;
 (c) etching said planarizing layer in accordance with said masking layer to open a plurality of contact holes each having a portion of said intermediate layer exposed at the bottom thereof and etching away said exposed portions of said intermediate layer from said bottoms of said contact holes to expose underlying portions of said partially formed integrated circuit structure; and
 (d) providing a patterned conductive layer to interconnect said contact holes to configure a predetermined electrical circuit.

26. A method for fabricating integrated circuits, comprising the steps of:
 (a) providing over a partially fabricated integrated circuit structure an intermediate layer and a planarizing layer over said intermediate layer;
 (b) providing a masking layer above said planarizing layer to define contact holes in predetermined locations, selectively etching said planarizing layer in accordance with said masking layer to open a plurality of contact holes each having a portion of said intermediate layer exposed at the bottom thereof and selectively etching away said exposed portions of said intermediate layer from said bottoms of said contact holes to expose underlying portions of said partially formed integrated circuit structure: and
 (c) providing a patterned conductive layer to interconnect said contact holes to configure a predetermined electrical circuit.

* * * * *